US010558100B2

(12) United States Patent
Lee et al.

(10) Patent No.: US 10,558,100 B2
(45) Date of Patent: Feb. 11, 2020

(54) LIQUID CRYSTAL DISPLAY DEVICES AND METHODS FOR MANUFACTURING SUCH DEVICES

(71) Applicant: a.u. Vista Inc., Milpitas, CA (US)

(72) Inventors: Seok-Lyul Lee, Hsinchu (TW); Fang-Chen Luo, Milpitas, CA (US)

(73) Assignee: A.U. VISTA INC., Milpitas, CA (US)

( * ) Notice: Subject to any disclaimer, the term of this patent is extended or adjusted under 35 U.S.C. 154(b) by 51 days.

(21) Appl. No.: 15/937,930

(22) Filed: Mar. 28, 2018

(65) Prior Publication Data

US 2019/0302548 A1    Oct. 3, 2019

(51) Int. Cl.
| | |
|---|---|
| G02F 1/1362 | (2006.01) |
| G02F 1/1334 | (2006.01) |
| G02F 1/1335 | (2006.01) |
| G02F 1/1343 | (2006.01) |
| G02F 1/1368 | (2006.01) |
| H01L 27/12 | (2006.01) |
| H01L 29/786 | (2006.01) |

(52) U.S. Cl.
CPC ...... *G02F 1/136209* (2013.01); *G02F 1/1334* (2013.01); *G02F 1/1368* (2013.01); *G02F 1/133514* (2013.01); *G02F 1/133617* (2013.01); *G02F 1/134336* (2013.01); *G02F 1/136286* (2013.01); *H01L 27/124* (2013.01); *H01L 27/1222* (2013.01); *H01L 27/1259* (2013.01); *H01L 29/78633* (2013.01); *H01L 29/78669* (2013.01); *G02F 2001/134345* (2013.01); *G02F 2202/103* (2013.01)

(58) Field of Classification Search
CPC .................................................. G02F 1/136209
See application file for complete search history.

(56) References Cited

U.S. PATENT DOCUMENTS

| | | | |
|---|---|---|---|
| 9,651,825 B2 | 5/2017 | Lee | |
| 2012/0327338 A1* | 12/2012 | Kobayashi | G02F 1/133512 349/106 |
| 2014/0159016 A1* | 6/2014 | Song | H01L 27/322 257/40 |
| 2014/0293171 A1* | 10/2014 | Jun | G02B 27/26 349/15 |
| 2014/0320782 A1* | 10/2014 | Uhm | G02F 1/155 349/62 |

(Continued)

*Primary Examiner* — Sang V Nguyen
(74) *Attorney, Agent, or Firm* — McClure, Qualey & Rodack, LLP

(57) ABSTRACT

A representative device includes: first and second substrates spaced to define a gap; a liquid crystal layer, positioned in the gap, having a plurality of display pixels configured to be switchable between an on state and an off state; a quantum dot layer positioned between the liquid crystal layer and the second substrate; a first shielding layer positioned between the first substrate and the liquid crystal layer, the first shielding layer having a plurality of first shield portions configured to prevent propagation of blue light therethrough; and a second shielding layer positioned between the liquid crystal layer and the second substrate, the second shielding layer defining a plurality of openings configured to permit propagation of the blue light therethrough; wherein each of the display pixels of the liquid crystal layer corresponds to at least one of the openings, and each of the openings corresponds to one of the first shield portions.

16 Claims, 14 Drawing Sheets

(56) References Cited

U.S. PATENT DOCUMENTS

| | | | |
|---|---|---|---|
| 2015/0338700 A1* | 11/2015 | Kimura | G06F 3/0412 |
| | | | 349/12 |
| 2016/0085095 A1* | 3/2016 | Chien | C09K 19/544 |
| | | | 349/33 |
| 2016/0085118 A1* | 3/2016 | Lee | G02F 1/133512 |
| | | | 349/62 |
| 2016/0274428 A1* | 9/2016 | Kim | G02F 1/136209 |
| 2017/0186824 A1* | 6/2017 | Lee | H01L 27/3223 |
| 2018/0083076 A1* | 3/2018 | Hanada | G02F 1/136209 |
| 2018/0120625 A1* | 5/2018 | Chen | G02F 1/133502 |
| 2018/0335656 A1* | 11/2018 | Chen | G02F 1/1334 |
| 2019/0011742 A1* | 1/2019 | Park | G02F 1/1368 |
| 2019/0206925 A1* | 7/2019 | Yamamoto | G02B 3/00 |

* cited by examiner

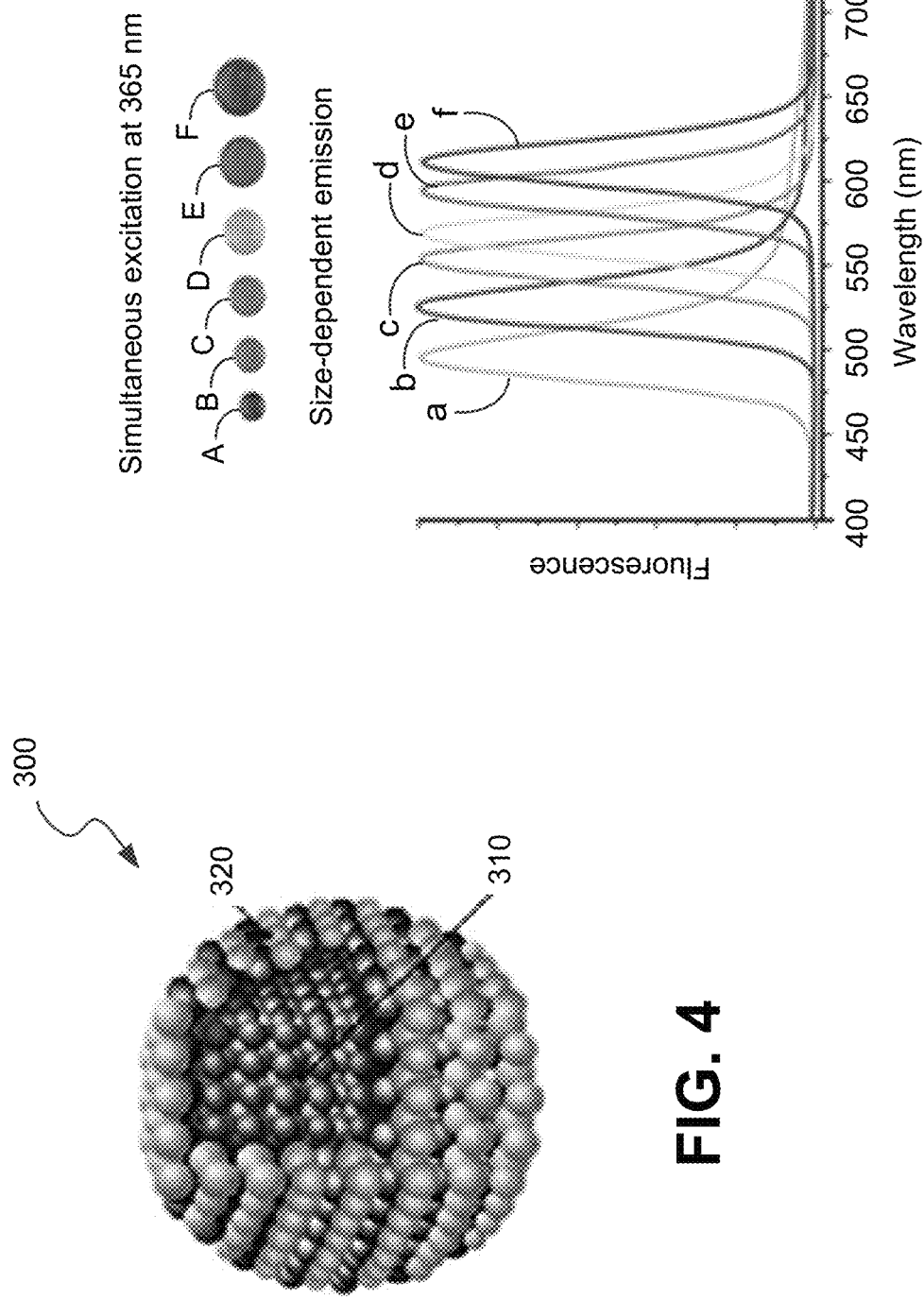

LIQUID CRYSTAL DISPLAY DEVICES AND METHODS FOR MANUFACTURING SUCH DEVICES

BACKGROUND

Technical Field

The disclosure generally relates to display technology.

Description of the Related Art

Various display technologies (e.g., liquid crystal displays (LCDs)) are widely used in displays for electronic devices, such as laptops, smart phones, digital cameras, billboard-type displays, and high-definition televisions. In addition, other display technologies, such as organic light-emitting diodes (OLEDs) and electronic paper displays (EPDs), are gaining in public attention.

LCD panels may be configured as disclosed, for example, in Wu et al., U.S. Pat. No. 6,956,631, which is assigned to AU Optronics Corp., the parent company of the assignee of the current application, and hereby incorporated by reference in its entirety. As disclosed in Wu et al. FIG. 1, the LCD panel may comprise a top polarizer, a lower polarizer, a liquid crystal cell, and a back light. Light from the back light passes through the lower polarizer, through the liquid crystal cell, and then through the top polarizer. As further disclosed in Wu et al. FIG. 1, the liquid crystal cell may comprise a lower glass substrate and an upper substrate containing color filters. A plurality of pixels comprising thin film transistor (TFT) devices may be formed in an array on the glass substrate, and a liquid crystal compound may be filled into the space between the glass substrate and the color filter forming a layer of liquid crystal material.

Still, the structure of TFTs in displays may be various. For instance, The TFTs, gate and data lines, and pixel electrodes may be formed in a multilayer structure such as that shown in FIGS. 1 and 2E of Lai et al., U.S. Pat. No. 7,170,092 and in its division U.S. Pat. No. 7,507,612, both of which are assigned to AU Optronics Corp., the parent company of the assignee of the current application, and both of which are hereby incorporated by reference in their entireties. The multilayer structure may comprise a first conducting layer, a first insulating layer, a semiconductor layer, a doped semiconductor layer, and a second conducting layer disposed in sequence on the substrate. It may further comprise a second insulating layer and a pixel electrode disposed on the second insulating layer. The first conducting layer may comprise at least one of a gate line or a gate electrode. The doped semiconductor layer may comprise a source and a drain. The second conducting layer may comprise a source electrode and a drain electrode. The multilayer structure may be formed using a series of wet and dry etching processes, for example as disclosed in Lai et al. FIGS. 2A-2D.

Additional techniques for forming TFTs are disclosed in Chen, U.S. Pat. No. 7,652,285, which is assigned to AU Optronics Corp., the parent company of the assignee of the current application, and hereby incorporated by reference in its entirety. As disclosed in Chen, to form the channel of the TFT, the second metal layer is etched in order to open a portion of the second metal layer over the gate electrode and to separate the source region and drain region. This etching can be performed in multiple ways, including the back-channel etching process disclosed for example in Chen FIGS. 2A-2E and the etch stop process disclosed for example in Chen FIGS. 5A-5D and 6. Chen discloses that TFT leakage currents may be reduced by adding a spacer layer formed at the sidewalls of the conductive doped amorphous silicon layer, isolating the conductive amorphous silicon layer from the insulating layer. Chen discloses that this spacer layer can be formed by oxidizing the exposed surface of the conductive amorphous silicon layer after the etch of the second metal layer is performed. Chen discloses that this surface may be oxidized by a number of different techniques, including oxygen plasma ashing, or the use of ozone plasma in the presence of carbon tetrafluoride and sulfur hexafluoride gases As explained in Sawasaki et al., U.S. Pat. No. 7,557,895, which is assigned to AU Optronics Corp., the parent company of the assignee of the current application, and hereby incorporated by reference in its entirety, the thickness of the liquid crystal layer typically must be uniformly controlled, in order to avoid unevenness in brightness across the LCD panel. As disclosed in Sawasaki et al., the required uniformity may be achieved by disposing a plurality of pillar spacers between the TFT substrate and the color filter substrate. As further disclosed in Sawasaki et al., the pillar spacers may be formed with different heights, such that some spacers have a height that is greater than the gap between the substrates and other spacers have a height that is less than the gap between the substrates. This configuration may permit the spacing between the substrates to vary with temperature changes but also prevent excessive deformation when forces are applied to the panel.

Sawasaki et al. further discloses a method for assembling the substrates with the liquid crystal material between them. This method comprises steps of preparing the two substrates, coating a sealing material on the circumference of the outer periphery of one of the pair of substrates, dropping an appropriate volume of liquid crystal on one of the pair of substrates, and filling in the liquid crystal between the pair of substrates by attaching the pair of substrates in a vacuum followed by returning the attached pair of substrates to atmospheric pressure.

In LCD panels, the semiconductor material making up the TFT channel may be amorphous silicon. However, as disclosed in Chen, U.S. Pat. No. 6,818,967, which is assigned to AU Optronics Corp., the parent company of the assignee of the current application, and hereby incorporated by reference in its entirety, poly-silicon channel TFTs offer advantages over amorphous silicon TFTs, including lower power and greater electron migration rates. Poly-silicon may be formed by converting amorphous silicon to poly-silicon via a laser crystallization or laser annealing technique. Use of the laser permits fabrication to occur at temperatures below 600° C., and the fabricating technique is thus called low temperature poly-silicon (LTPS). As disclosed in Chen, the re-crystallization process of LTPS results in the formation of mounds on the surface of the poly-silicon layer, and these mounds impact the current characteristics of the LTPS TFT. Chen discloses a method to reduce the size of the LTPS surface mounds, by performing a first anneal treatment, then performing a surface etching treatment, for example using a solution of hydrofluoric acid, and then performing a second anneal treatment. The resulting LTPS surface has mounds with a height/width ratio of less than 0.2. A gate isolation layer, gate, dielectric layer, and source and drain metal layers can then be deposited above the LTPS layer to form a complete LTPS TFT.

As disclosed in Sun et al., U.S. Pat. No. 8,115,209, which is assigned to AU Optronics Corp., the parent company of the assignee of the current application, and hereby incorporated by reference in its entirety, a disadvantage of LTPS TFTs compared to amorphous silicon TFTs is a relatively large leakage current during TFT turn off. Use of multiple gates reduces leakage current, and Sun et al. discloses a number of different multi-gate structures for a polycrystalline silicon TFT, including those shown in Sun et al. FIGS. 2A-2B and 3-6.

An alternative to LCD devices is the active matrix organic light-emitting device (OLED), as disclosed for example in Huang, U.S. Pat. No. 6,831,410, which is assigned to AU Optronics Corp., the parent company of the assignee of the current application, and hereby incorporated by reference in its entirety. As disclosed in Huang, a TFT is formed over a substrate. An insulating layer is formed, covering the TFT. A contact opening is formed in the insulating layer, exposing the drain terminal of the TFT, and an anode layer is formed over the insulating layer and the exposed opening, forming a contact between the anode layer and the TFT drain terminal. A light-emitting layer is formed over the anode layer, and a cathode layer is formed over the light-emitting layer. As explained in Huang, there is a risk that the cathode layer will form a short circuit with the anode layer via the contact opening. To prevent such short circuits, Huang discloses depositing a planarization layer that fills the space above the contact. The light-emitting and cathode layers are then formed over the planarization layer.

As mentioned above, a conventional LCD device may include a stack structure that incorporates a diffusion film, a plurality of polarizers, a liquid crystal layer between the polarizers, a color filter (CF) layer (if configured as a color LCD device), and transparent electrodes for driving the liquid crystal molecules of the liquid crystal layer. Unfortunately, the stack structures generally have an optical efficiency of only about 3% to about 5%, which tends to be a performance-limiting factor of such a device. Specifically, when the light is emitted by the backlight module and passes through the diffusion film, the polarizers, the liquid crystal layer, the CF layer, and the transparent electrodes, the light is partially absorbed by each of the layers. Therefore, there is a desire for improving optical efficiency that existing technology has been inadequate for addressing.

SUMMARY

Liquid crystal display devices and methods for manufacturing such devices are provided. In one embodiment, a liquid crystal display device comprises: a first substrate; a second substrate spaced from the first substrate to define a gap therebetween; a liquid crystal layer, positioned in the gap, having a plurality of display pixels, wherein each of the display pixels of the liquid crystal layer is configured to be switchable between an on state and an off state; a quantum dot layer positioned in the gap between the liquid crystal layer and the second substrate; a first shielding layer positioned between the first substrate and the liquid crystal layer, the first shielding layer having a plurality of first shield portions configured to prevent propagation of blue light therethrough; and a second shielding layer positioned between the liquid crystal layer and the second substrate, the second shielding layer defining a plurality of openings configured to permit propagation of the blue light therethrough; wherein each of the display pixels of the liquid crystal layer corresponds to at least one of the openings, and each of the openings corresponds to one of the first shield portions.

In some embodiments, the liquid crystal display device further comprises a backlight module configured to emit blue light; the first substrate is positioned between the backlight module and the liquid crystal layer; and the blue light emitted by the backlight module is directed through the first substrate and towards the liquid crystal layer.

In some embodiments, the first shielding layer and the second shielding layer are positioned such that, for each display pixel of the liquid crystal layer, when the display pixel is in the on state with liquid crystal molecules of the display pixel being driven to have a predetermined retardation to form at least one liquid crystal lens, a portion of the blue light passing the first shielding layer is refracted by the at least one liquid crystal lens to directly penetrate through at least one of the openings to reach the quantum dot layer.

In some embodiments, the liquid crystal display device further comprises: a plurality of first transparent electrodes disposed between the first substrate and the liquid crystal layer; and a plurality of second transparent electrodes disposed between the second shielding layer and the liquid crystal layer, wherein at least one of the first transparent electrodes and at least one of the second transparent electrodes corresponds to each of the display pixels and are configured to switch the display pixels between the off state and the on state.

In some embodiments, in plan view: each of the plurality of first shield portions is circular; and each of the plurality of openings is circular.

In some embodiments, in plan view: each of the plurality of first shield portions is rectangular; and each of the plurality of openings is rectangular.

In some embodiments, the liquid crystal display device further comprises a plurality of first transparent electrodes disposed between the first substrate and the liquid crystal layer; and in plan view, the plurality of first transparent electrodes are configured as rectangles with the plurality of first shield portions being positioned within interiors of the rectangles.

In some embodiments, the liquid crystal display device further comprises a color filter layer disposed between the quantum dot layer and the second substrate.

In some embodiments, sizes of the first shield portions of the first shielding layer are bigger than or equal to sizes of corresponding ones of the openings of the second shielding layer.

In some embodiments, the liquid crystal layer is formed of polymer dispersed liquid crystal material.

In some embodiments, the liquid crystal display device lacks a polarizer.

In some embodiments, the polymer dispersed liquid crystal material has a plurality of polymer-encapsulated liquid crystal droplets, and each of the plurality of polymer-encapsulated liquid crystal droplets has a droplet size smaller than 400 nm.

In some embodiments, at least one of the first shielding layer or the second shielding layer is formed of black resin.

In some embodiments, the liquid crystal display device further comprises: a gate line dispose on the first substrate; a data line disposed on the first substrate intersecting with the gate line; and a thin film transistor disposed on the first substrate, and electrically connecting to the gate line and the data line, and wherein the first shielding layer and the gate line are present in a same layer.

In some embodiments, the liquid crystal display device further comprises: a gate line dispose on the first substrate; a data line disposed on the first substrate intersecting with the gate line; and a thin film transistor disposed on the first substrate, and electrically connecting to the gate line and the data line, and wherein the first shielding layer and the data line are present in a same layer.

In one embodiment, a method of forming a liquid crystal display device comprises: providing a first substrate; disposing a first shielding layer on the first substrate, the first shielding layer having a plurality of first shield portions configured to prevent propagation of blue light therethrough; providing a second substrate; disposing a quantum dot layer on the second substrate; disposing a second shielding layer on the second substrate, the second shielding layer defining a plurality of second openings configured to permit propagation of the blue light therethrough; positioning the first substrate and the second substrate to define a gap therebetween; and positioning a liquid crystal material in the gap to form a liquid crystal layer, having a plurality of display pixels, wherein each of the display pixels of the liquid crystal layer is configured to be switchable between an on state and an off state; wherein each of the display pixels of the liquid crystal layer corresponds to at least one of the openings, and each of the openings corresponds to one of the first shield portions.

In some embodiments, when the display pixel is in the on state, liquid crystal molecules of the display pixel are driven to have a predetermined retardation to form at least one liquid crystal lens such that a portion of the blue light passing the first shielding layer is refracted by the at least one liquid crystal lens to directly penetrate through at least one of the openings to reach the quantum dot layer.

In some embodiments, when the display pixel is in the off state, the plurality of first shield portions and the second shielding layer prevent propagation of the blue light to the quantum dot layer.

In some embodiments, the method further comprises disposing a thin film transistor, a gate line, and a data line on the first substrate, and wherein in disposing the first shielding layer and the gate line, both are present in a same layer.

In some embodiments, the method further comprises disposing a thin film transistor, a gate line, and a data line on the first substrate, and wherein in disposing the first shielding layer and the data line, both are present in a same layer.

Other objects, features, and/or advantages will become apparent from the following detailed description of the preferred but non-limiting embodiments. The following description is made with reference to the accompanying drawings.

BRIEF DESCRIPTION OF THE DRAWINGS

FIG. 4 is a schematic diagram of an embodiment of a quantum dot structure.

FIG. 5 is a graph depicting size-dependent emission of an embodiment of a quantum dot structure with fluorescence plotted versus wavelength.

DETAILED DESCRIPTION

For ease in explanation, the following discussion describes several embodiments of liquid crystal display devices and methods for manufacturing such devices. It is to be understood that the invention is not limited in its application to the details of the particular arrangements shown since the invention is capable of other embodiments. Also, the terminology used herein is for the purpose of description and not of limitation.

In this regard, as will be described in greater detail below, liquid crystal display devices may involve the use of first and second shielding layers, which are configured to prevent passage of light when display pixels of the device are in an off state and, alternately, to permit passage of light when in an on state. In some embodiments, an improvement in optical efficiency may be achieved as a polarizer may be omitted from the stack structure of the device. Preferred embodiments of the present invention will now be described with reference to the drawings.

Figure 1:
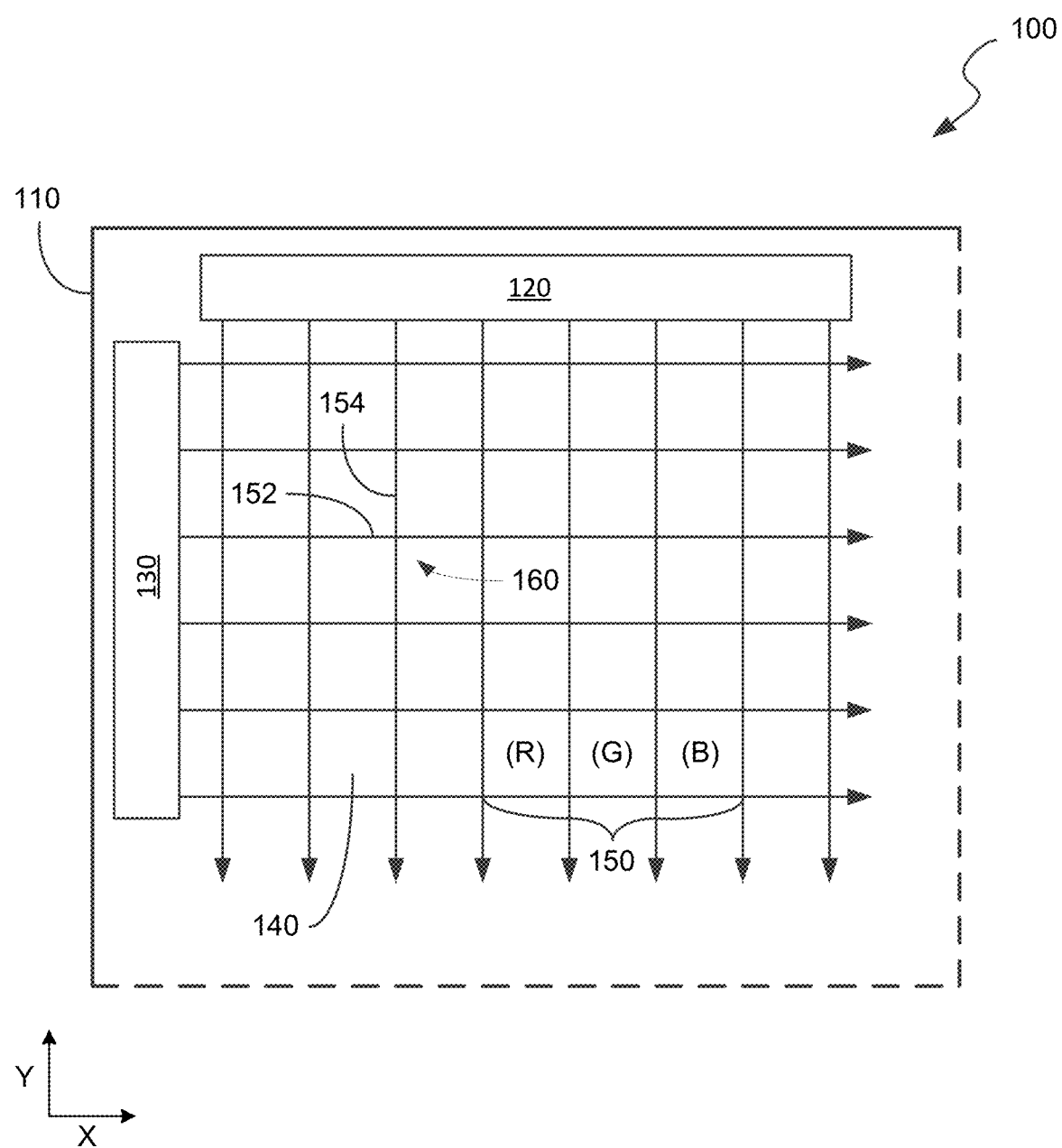
FIG. 1 is a schematic diagram of a portion of an embodiment of a liquid crystal display device.

With reference to FIG. 1, a portion of an embodiment of a liquid crystal display device 100 is depicted. Fundamentally, liquid crystal display device 100 includes an LCD panel 110 with data driver circuitry 120 and gate driver circuitry 130. The circuits and functions in the embodiments of the present invention can be implements by hardware, software or a combination of hardware and software such as microcontrollers, application-specific integrated circuits (ASIC) and programmable microcontrollers.

In keeping with the description of FIG. 1, panel 110 incorporates a plurality of pixels (typically thousands of pixels, e.g., pixels 140, 150), which are arranged in a two-dimensional array comprising a plurality of rows and columns. For ease in illustration, only a few pixels are illustrated in FIG. 1. As is known, in a thin film transistor (TFT) LCD panel, a pixel is typically formed from three pixel elements (sub-pixels): one red, one green, and one blue, although various configurations may be used. For instance, pixel 150 is depicted as including three sub-pixels—a red sub-pixel (R), a green sub-pixel (G), and a blue sub-pixel (B). One or more transistors and one or more storage capacitors are typically coupled to each sub-pixel, thereby forming driving circuitry for the associated sub-pixel.

The transistors of all pixels in a given row typically have their gate electrodes connected to a gate (scan) line (e.g., line 152), and their source electrodes connected to a data line (e.g., line 154). The gate driver circuitry 130 and data driver circuitry 120 control the voltage applied to the respective gate and data lines to individually address each sub-pixel in the panel. By controllably pulsing the respective sub-pixel driving transistors, the driver circuitry can control the transmissivity of each sub-pixel, and thereby control the color of each pixel. The storage capacitors assist in maintaining the charge across each pixel between successive pulses (which are delivered in successive frames).

Figure 2:
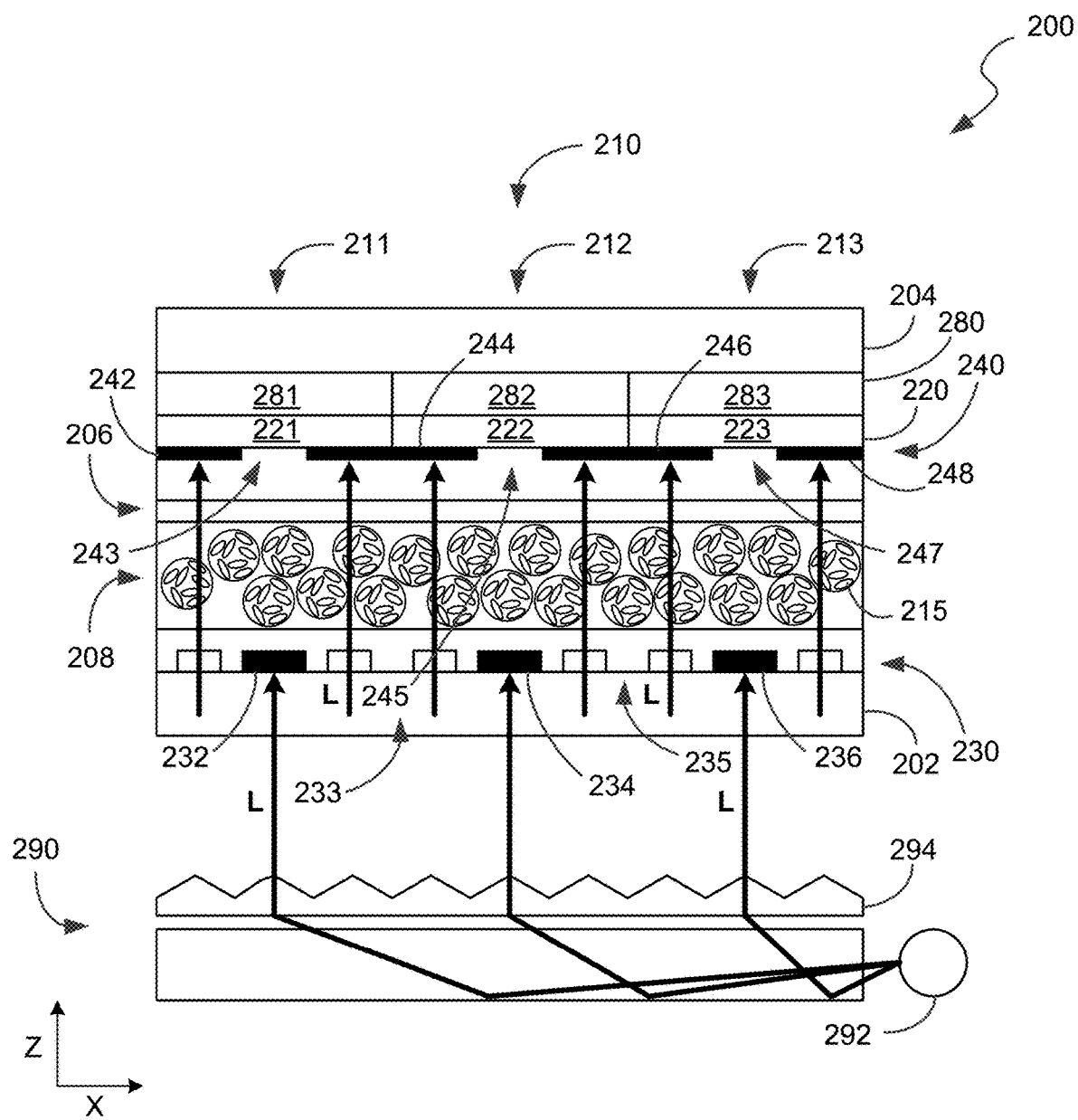
FIG. 2 is a schematic diagram depicting a cross-section of an embodiment of a liquid crystal display device, in which a display pixel is in an off state.

FIG. 2 is a schematic diagram depicting a cross-section of an embodiment of a liquid crystal display device (that may implement the array configuration of FIG. 1, for example), in which a display pixel is in an off state. As shown in FIG. 2, display device 200 includes a substrate 202 (sometimes referred to herein as a first or lower substrate) and a substrate 204 (sometimes referred to herein as a second or upper substrate), which is spaced from substrate 202 to define a gap 206 between the substrates. A liquid crystal layer 208 is positioned in gap 206. Liquid crystal layer 208 is associated with a plurality of display pixels, each of which is configured to be switchable between the off state (depicted in FIG. 2) and on state. In this embodiment, display pixel 210 is includes sub-pixels 211, 212, and 213, which are configured to display different colors. Specifically, sub-pixel 211 is a red sub-pixel, sub-pixel 212 is a green sub-pixel, and sub-pixel 213 is a blue sub-pixel.

In some embodiments, liquid crystal layer 208 is formed of polymer-dispersed liquid crystal (PDLC) material, which incorporates a plurality of polymer-encapsulated liquid crystal droplets (e.g., droplet 215). PDLC material exhibits polarization independent phase modulations due to elimination of Rayleigh scattering when the droplet size is smaller than the wavelength of incident light. In some embodiments, therefore, each of the plurality of polymer-encapsulated liquid crystal droplets may exhibit a droplet size smaller than 400 nm.

A quantum dot layer 220 is positioned in gap 206 between liquid crystal layer 208 and substrate 204. Quantum dot layer 220 is formed of quantum dots that are configured to emit light in response to excitation from light of a certain wavelength based on the sizes of the quantum dots. In this embodiment, quantum dot layer 220 includes sub-pixel regions, with each being configured to emit light of a particular color associated with its respective sub-pixel. For instance, quantum dot region 221 (corresponding to sub-pixel 211) is configured to emit light associated with a red sub-pixel, quantum dot region 222 (corresponding to sub-pixel 212) is configured to emit light associated with a green sub-pixel, and quantum dot region 223 (corresponding to sub-pixel 213) is configured to emit light associated with a blue sub-pixel. More detail regarding quantum dots is provided with respect to FIGS. 4 and 5.

A shielding layer 230 is positioned between substrate 202 and liquid crystal layer 208. Shielding layer 230 incorporates a plurality of shield portions that define a plurality of openings. For example, shield portions 232, 234, and 236 are depicted, with opening 233 being disposed between shield portions 232 and 234, and opening 235 being disposed between shield portions 234 and 236. The plurality of shield portions of shielding layer 230 are configured to prevent propagation of blue light, which is represented by the arrows extending parallel to the z-axis (several of which are labeled "L"). Thus, blue light is only able to propagate to liquid crystal layer 208 via the openings in shielding layer 230.

Another shielding layer (i.e., shielding layer 240) is positioned between liquid crystal layer 208 and substrate 204. Shielding layer 240 also incorporates a plurality of shield portions that define a corresponding plurality of openings. For example, shield portions 242, 244, 246, and 248 (which may be contiguous in some embodiments) are depicted, with opening 243 being disposed between shield portions 242 and 244, opening 245 being disposed between shield portions 244 and 246, and opening 247 being disposed between shield portions 246 and 248. Notably, each of the display pixels of liquid crystal layer 208 corresponds to at least one of the openings of shielding layer 240. In this embodiment, at least one of the openings of shielding layer 240 corresponds to a sub-pixel. By way of example, opening 243 corresponds to sub-pixel 211, opening 245 corresponds to sub-pixel 213, and opening 247 corresponds to sub-pixel 215.

As with the shield portions of shielding layer 230, the shield portions of shielding layer 240 are configured to prevent propagation of the blue light therethrough. In some embodiments, one or both of shielding layers 230, 240 may be formed of an opaque material, such as an opaque metal or black resin, for example. Thus, blue light is only able to propagate to quantum dot layer 220 via the openings in shielding layer 240. Significantly, each of the openings in shielding layer 240 corresponds to one of the shield portions of shielding layer 230. For instance, opening 245 corresponds to shield portion 234.

Liquid crystal display device 200 also includes a backlight module 290, with substrate 202 being positioned between backlight module 290 and liquid crystal layer 208. Backlight module 290 incorporates a light source 292 and a collimator 294 (e.g., a collimated film). Backlight module 290 is configured to emit collimated (unpolarized) blue light that is directed through substrate 202 and towards liquid crystal layer 208. The plurality of shield portions of shielding layer 230 are configured to prevent downstream propagation of the collimated blue light that impinges upon the upstream surfaces of the shield portions so that the only blue light that is able to propagate to liquid crystal layer 208 does so via the openings in shielding layer 230.

Based on the disposition of shield portion 234 along the direct propagation path of blue light being directed toward liquid crystal layer 208, that light is prevented from propagating downstream and through opening 245 when display pixel 210 is in the off state. Notably, in embodiments in which PDLC material is used for liquid crystal layer 208, at V=0, the liquid crystal droplets are randomly oriented and the refractive index of the PDLC material is isotropic for unpolarized light. So configured, in embodiments in which backlight is provided by unpolarized blue light, the blue light should not be refracted from a direct propagation path toward the openings in shielding layer 240. Notably, in such an embodiment, the liquid crystal display device may lack a polarizer, such as is often provided upstream or downstream of liquid crystal layer 208.

Figure 3:
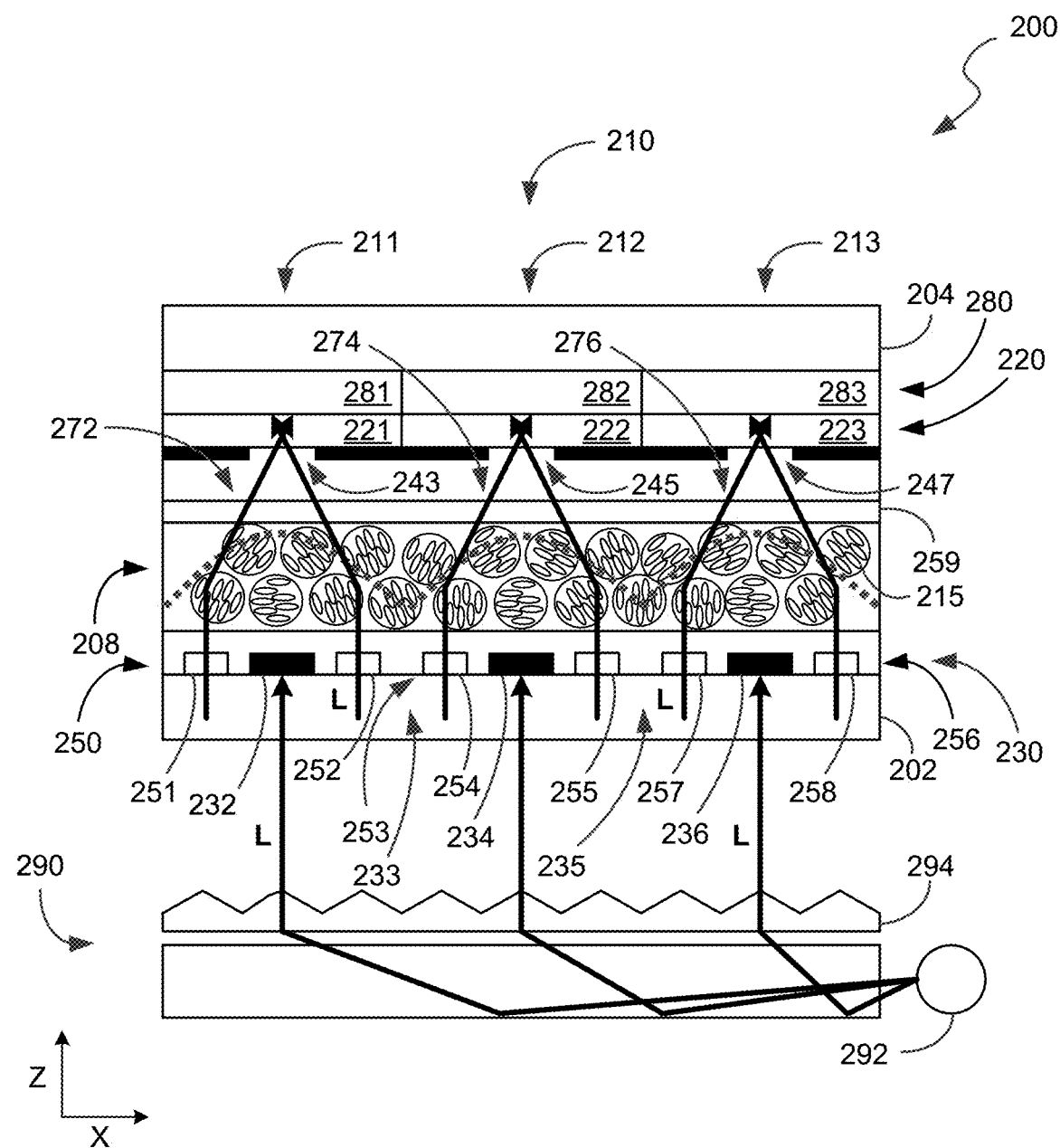
FIG. 3 is a schematic diagram of the embodiment of FIG. 2, in which the display pixel is in an on state.

FIG. 3 is a schematic diagram of the embodiment of FIG. 2, in which display pixel 210 is in an on state. As shown in FIG. 3, display device 200 also includes transparent electrodes that are configured to switch display pixel 210 between the off state and the on state. In particular, a plurality of transparent pixel electrodes is disposed between substrate 202 and liquid crystal layer 208. For example, pixel electrode 250 (which includes portions 251 and 252 disposed on opposite sides of shield portion 232), pixel electrode 253 (which includes portions 254 and 255 disposed on opposite sides of shield portion 234), and pixel electrode 256 (which includes portions 257 and 258 disposed on opposite sides of shield portion 236) are depicted. Additionally, common electrode 259 is disposed between shielding layer 240 and liquid crystal layer 208. At least one of the electrodes disposed between substrate 202 and liquid crystal layer 208 and at least one of the electrodes disposed between shielding layer 240 and liquid crystal layer 208 corresponds to each of the display pixels. In this embodiment, all of the depicted electrodes correspond to display pixel 210, with electrode 250 corresponding to sub-pixel 211, electrode 253 corresponding to sub-pixel 212, and electrode 256 corresponding to sub-pixel 213.

During operation, as the applied voltage across the electrodes exceeds a threshold voltage (Vth), the liquid crystal display device transitions to the on state, with the LC molecules inside the liquid crystal droplets being reoriented by the electric fields (depicted by the representative waveform dashed line). This reorientation is attributable to the electric energy being large enough to overcome the anchoring energy of the droplet boundary and internal elastic free energy of the LC molecules. In the on state, the LC molecules have been driven to exhibit a predetermined retardation to form at least one liquid crystal lens. For instance, lens 272 corresponds to sub-pixel 211, lens 274 corresponds to sub-pixel 212, and lens 276 corresponds to sub-pixel 213. So configured, a portion of the blue light passing through one of the openings in shielding layer 230 is refracted by at least one lens to directly penetrate through at least one of the openings in shielding layer 240 to reach the quantum dot layer. As an example, a portion of blue light passing through opening 233 is refracted by lens 272 to directly penetrate through opening 243, while another portion of the blue light passing through opening 233 is refracted by lens 274 to directly penetrate through opening 245.

In response to the blue light penetrating through the openings in shielding layer 240, the light enters the quantum dot layer 220 and excites the quantum dots associated with the corresponding quantum dot regions 221-223. The quantum dot regions emit light that is directed through a color filter (CF) layer 280, which includes red (R), green (G), and blue (B) filter regions (281-283, respectively), disposed between quantum dot layer 220 and substrate 204. Thus, in this embodiment, sub-pixel 211 emits red light, sub-pixel 212 emits green light, and sub-pixel 213 emits blue light.

In this regard, a quantum dot is a nanocrystal core/shell structure made of semiconductor materials that are small enough to exhibit quantum mechanical properties. For example, the size of a quantum dot may be about 1-10 nm in diameter. By way of example, FIG. 4 is a schematic diagram of an embodiment of a quantum dot structure. As shown in FIG. 4, quantum dot 300 incorporates a plurality of core nanocrystals (e.g., nanocrystal 310) and a plurality of shell nanocrystals (e.g., nanocrystal 320). Specifically, the excitons of the quantum dots are confined in all three spatial dimensions. In some embodiments, the quantum dots can be synthesized with larger (thicker) shells, which may be directly correlated to the spectroscopic properties of particle lifetime, emission intensity, and long-term stability.

One of the optical properties of the quantum dots relates to size-dependent emission. Specifically, when a quantum dot is excited by light of a certain wavelength, the light emitted by the excited quantum dot is determined by the crystal size of the quantum dot. In particular, as the size of the quantum dot becomes larger, the fluorescence spectrum of the emission moves toward red light (i.e., exhibits a longer wavelength). FIG. 5 is a graph depicting size-dependent emission of an embodiment of a quantum dot structure with fluorescence plotted versus wavelength.

As shown in FIG. 5, six quantum dots (A, B, C, D, E, and F) having different sizes of nanocrystals (increasing in size from left to right) are simultaneously excited by incident light with a wavelength of 365 nm (which is in the range of violet light), and the emissions of the quantum dots (correspondingly labeled a-f) are shown to have different wavelengths, ranging from about 450 nm to about 650 nm, which substantially cover the wavelength range of the visible spectrum. Notably, the emission of the quantum dots may include the three primary colors of R (620-750 nm of wavelength), G (495-570 nm), and B (450-495 nm). In some embodiments, the full width at half maximum (FWHM) of the quantum dots may be about 30-40 nm. Generally, the quantum dots have high quantum yields of about 90%.

Figure 6:
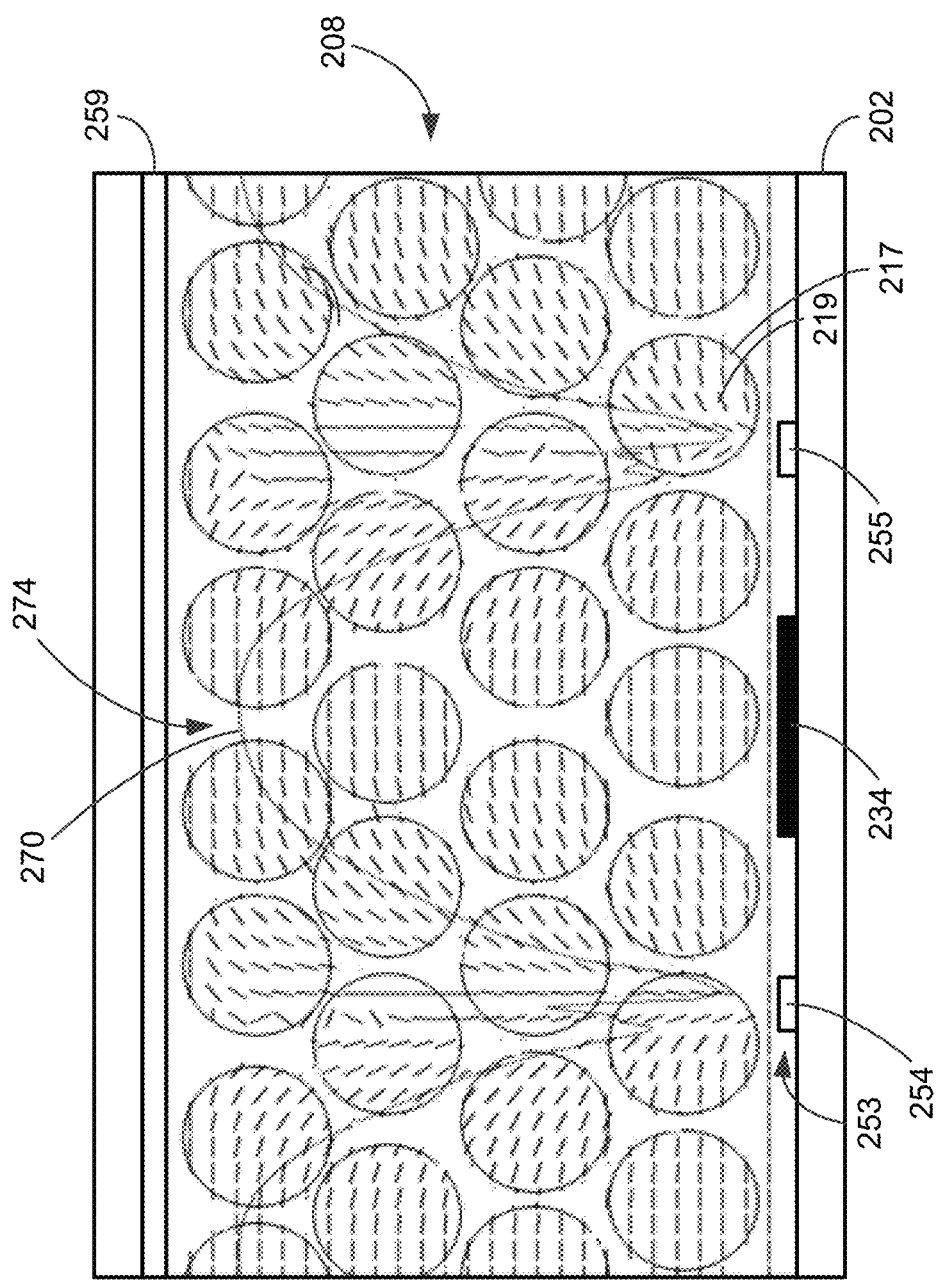
FIG. 6 is a schematic diagram depicting a cross-section of a portion of the embodiment of FIGS. 2 and 3 showing an on state.

FIG. 6 depicts a portion of liquid crystal display device 200 (see, FIGS. 2 and 3) with liquid crystal layer 208 exhibiting an on state. As shown, in response to a predetermined voltage difference being applied between pixel electrode 253 (which includes electrode portions 254, 255) and common electrode 259, liquid crystal molecules of the polymer-encapsulated liquid crystal droplets (e.g., droplet 217) are oriented to exhibit the on state. In particular, liquid crystal molecules (e.g., molecule 219) of liquid crystal layer 208 rotate due to the associated electric field (designated by line 270), which is generated by the predetermined voltage difference, to form liquid crystal lens 274.

Figure 7:
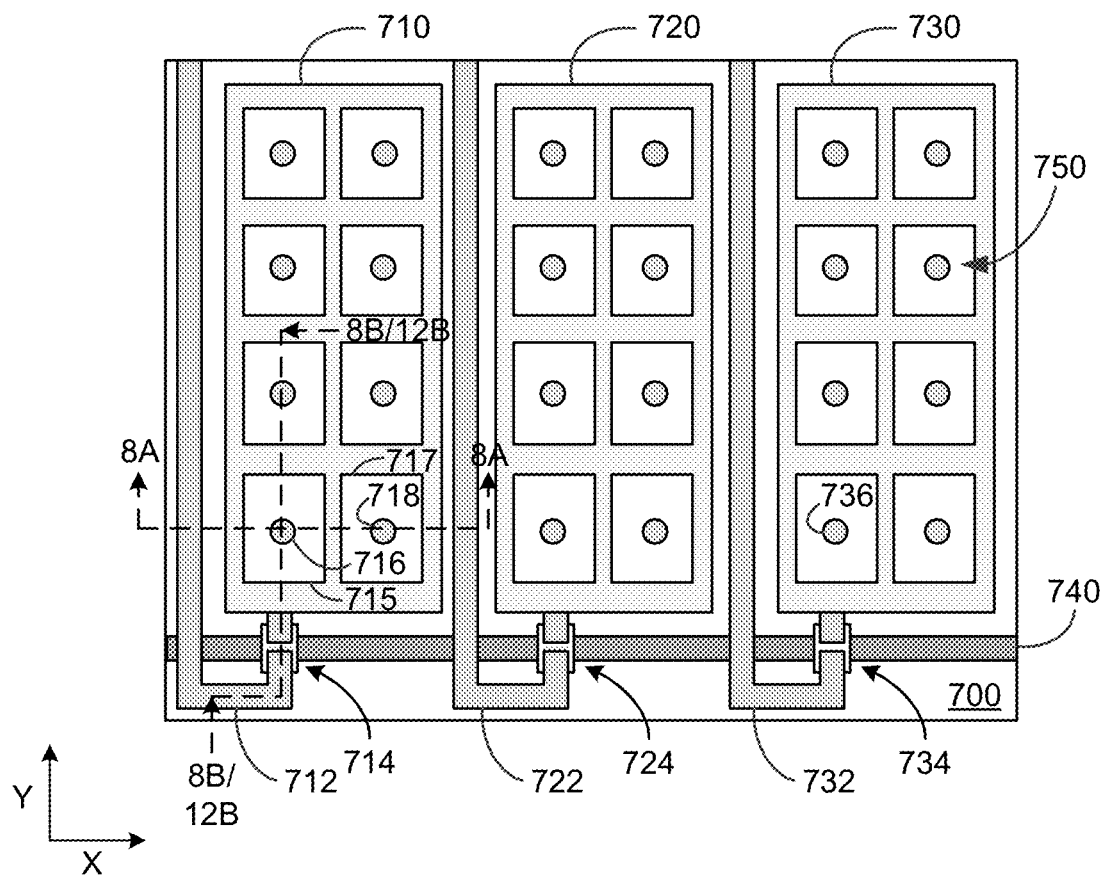
FIG. 7 is a schematic diagram depicting a plan view of an embodiment of a lower substrate and associated features.
Figure 8A:
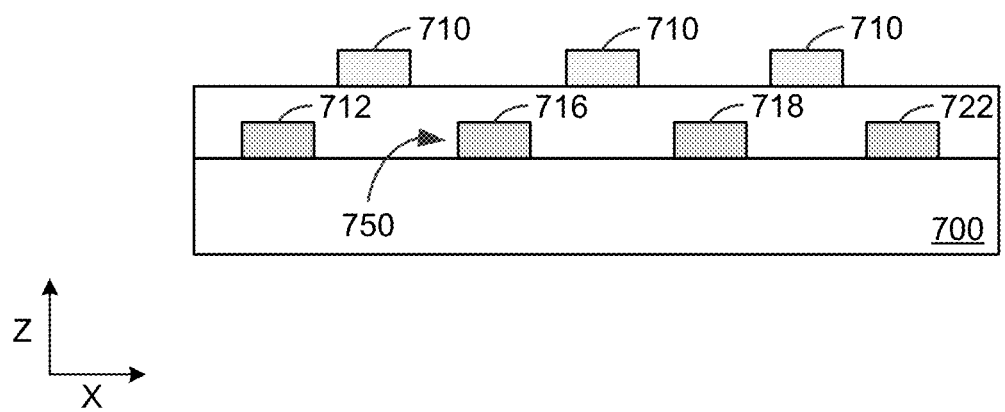
FIG. 8A is a schematic diagram depicting a cross-section of the embodiment of FIG. 7, as viewed along section line 8A-8A.
Figure 8B:
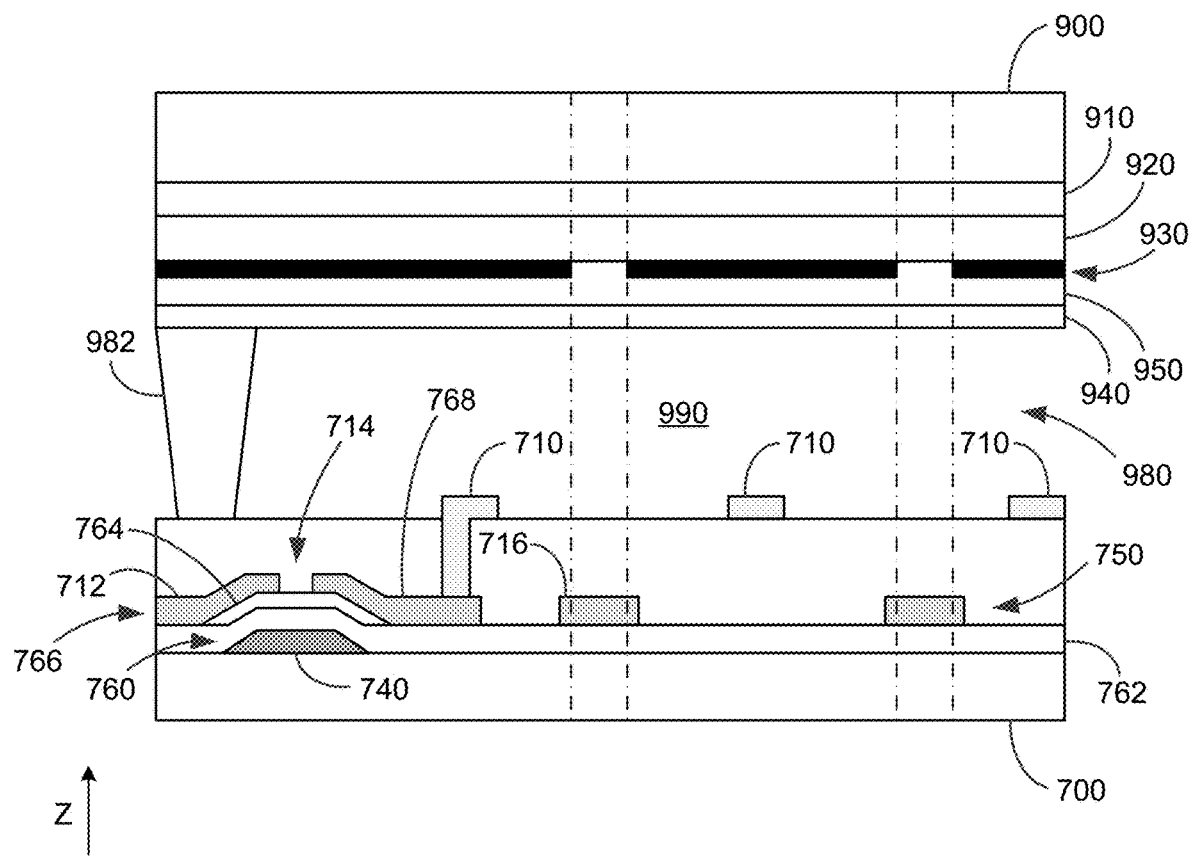
FIG. 8B is a schematic diagram depicting a cross-section of the components of FIGS. 7 and 9 in an assembled configuration, as viewed along section line 8B-8B.

With reference to FIGS. 7, 8A, and 8B, a portion of a lower substrate 700 is depicted upon which a plurality of transparent electrodes (i.e., electrodes 710, 720 and 730) are disposed. Each of the electrodes is associated with a corresponding signal (data) line and thin film transistor, as well as a gate line 740, with each being disposed on substrate 700. Specifically, electrode 710 is associated with data line 712 and thin film transistor 714, electrode 720 is associated with data line 722 and thin film transistor 724, and electrode 730 is associated with data line 732 and thin film transistor 734. Thin film transistors 714, 724, 734 are electrically connected to gate line 740 and the respective data lines at locations where the corresponding lines intersect.

In this embodiment, each of the electrodes is configured as a rectangle that defines a plurality of openings. For instance, electrode 710 includes eight such openings (e.g., openings 715 and 717). A shielding layer 750 also is disposed on substrate 700. Shielding layer 750 includes multiple shield portions (e.g., shield portions 716, 718, 736) that are positioned within an outer periphery of the associated electrode. By way of example, shield portions 716 and 718 are positioned within the interior of electrode 710. More specifically, shield portion 716 is positioned within opening 715, and shield portion 718 is positioned within opening 717. As shown in FIG. 8A, the data lines (e.g., data lines 712 and 722) and the shield portions (e.g., shield portions 716, 718) are present in a same layer. Note also, that the shield portions are circular in this embodiment.

As shown in FIG. 8B, substrate 700 is provided. A gate metal layer 760 (e.g., an opaque metal layer) is disposed on substrate 700 to form a gate line 740. A gate insulator layer 762 (e.g., SiNx, SiOx) is formed over gate metal layer 760. A TFT 714 is formed over gate line 740 by depositing amorphous silicon 764 (e.g., N+ doped a:Si, oxide) followed by a material layer 766 to form source/drain regions 768, as well as data line 712 and shield layer 750 (which includes shield portion 716).

Following TFT and data line formation, a passivation layer 770 (e.g., SiNx, SiOx) is provided. Passivation layer 770 is then configured to permit electrical connection between TFT 714 and transparent pixel electrodes (e.g., pixel electrode 710) disposed on passivation layer 770. In this embodiment, pixel electrode 710 may be formed of ITO, for example.

In FIG. 8B, a substrate 900 also is provided, upon which a color filter layer 910 is disposed. A quantum dot layer 920 is formed over color filter layer 910, and then a shielding layer 930 (e.g., an opaque material layer) is formed over quantum dot layer 920. An insulating layer 950 (overcoat) is formed over shielding layer 930, after which a transparent electrode 940 is formed.

Substrates 700 and 900 are then positioned to form a gap 980 therebetween. Spacers (e.g., spacer 982) are used to maintain gap 980, with a liquid crystal layer 990 being disposed within the gap.

Figure 9:
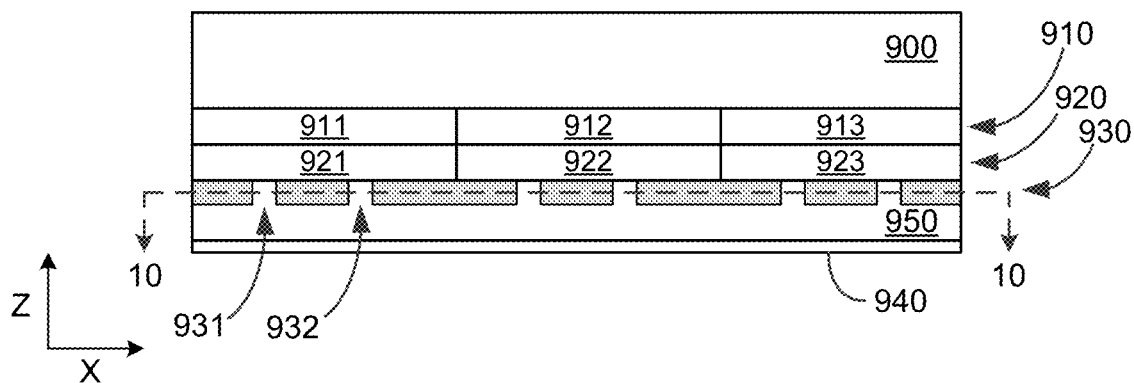
FIG. 9 is a schematic diagram depicting a cross-section of an embodiment of an upper substrate and associated features.
Figure 10:
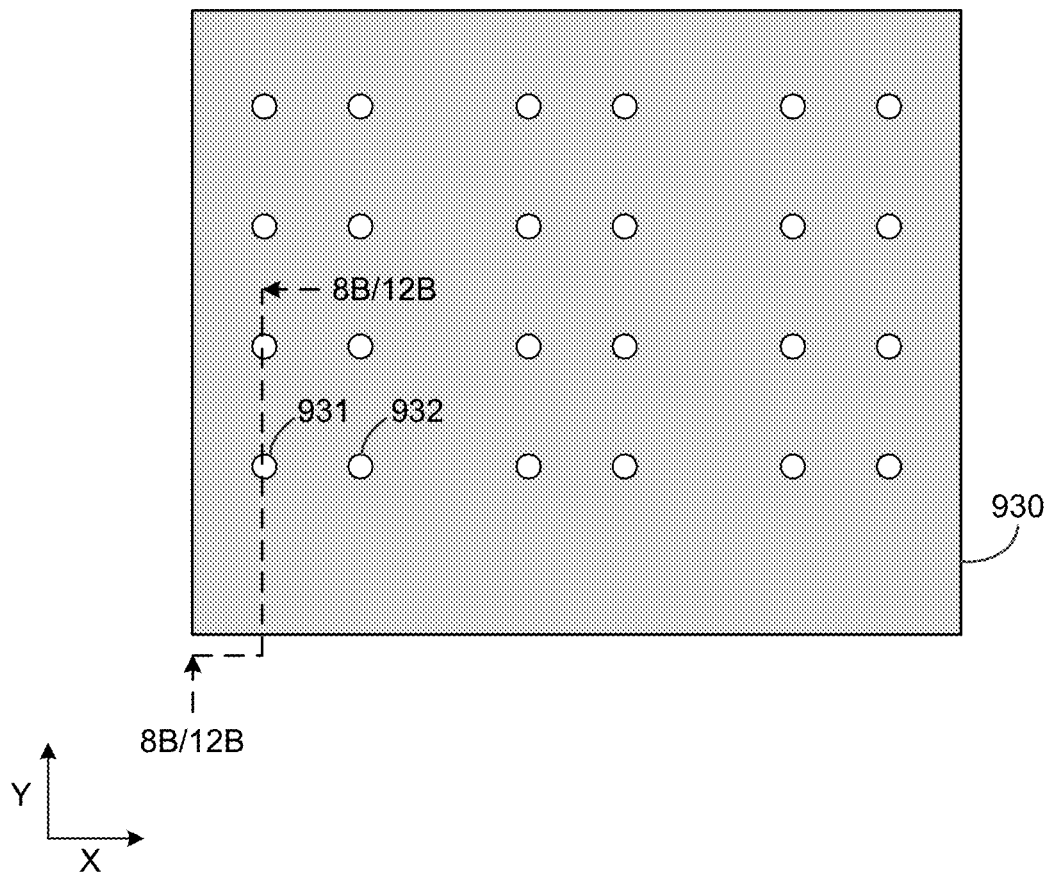
FIG. 10 is a schematic diagram depicting a plan view of the embodiment of FIG. 9, as viewed along section line 10-10.

FIGS. 9 and 10, upper substrate 900 and associated features are shown in greater detail. As shown in FIG. 9, color filter layer 910 and quantum dot layer 920 are disposed on substrate 900. Color filter layer 910 includes regions 911, 912, and 913, with each being associated with a different color. Similarly, quantum dot layer 920 includes regions 921, 922, and 923, with each being associated with a different color and aligned with a corresponding region of color filter layer 910. Shielding layer 930 also is disposed on substrate 900. In particular, shielding layer 930 defines a plurality of openings (e.g., openings 931 and 932). Additionally, transparent electrode 940 is disposed on substrate 900, with shielding layer 930 being positioned between electrode 940 and quantum dot layer 920. Note that, in this embodiment, insulating layer 950 is disposed between shielding layer 930 and electrode 940.

With brief reference back to FIGS. 7, 8A, and 8B, openings 931 and 932 correspond to shield portions 716 and 718, respectively, both in shape (i.e., circular) and in alignment. That is, each of the shield portions is located along a direct propagation path between a backlight and a corresponding one of the openings. Owing to the sizes of the shield portions (e.g., shield portion 716) being equal to or larger than the sizes of corresponding openings (e.g., opening 931), light is prevented from reaching quantum dot layer 920 unless the light is refracted via control of the liquid crystal material (not shown) disposed between substrates 700 and 900.

Figure 11:
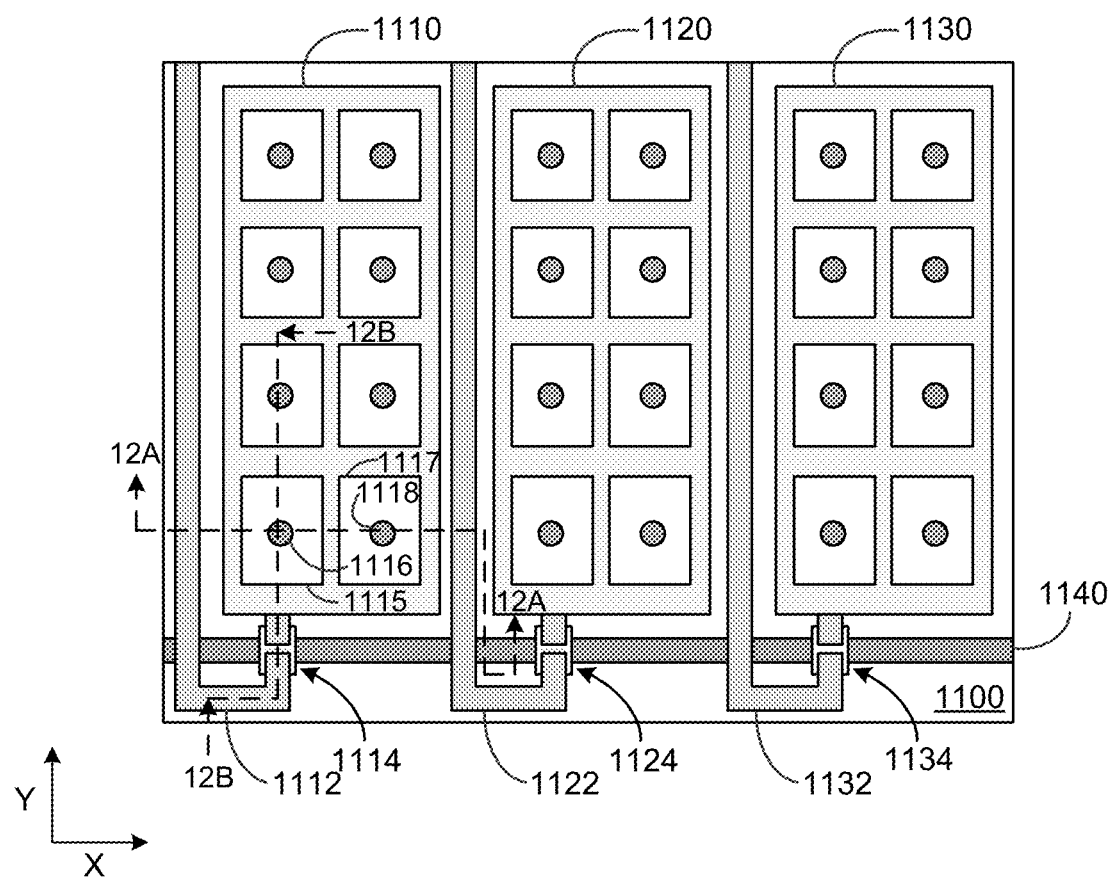
FIG. 11 is a schematic diagram depicting a plan view of another embodiment of a lower substrate and associated features.
Figure 12A:
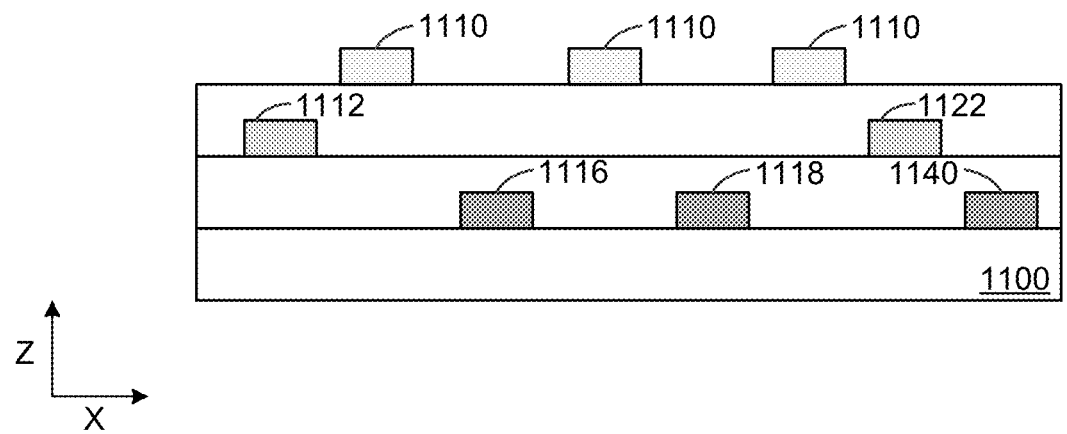
FIG. 12A is a schematic diagram depicting a cross-section of the embodiment of FIG. 11, as viewed along section line 12A-12A.
Figure 12B:
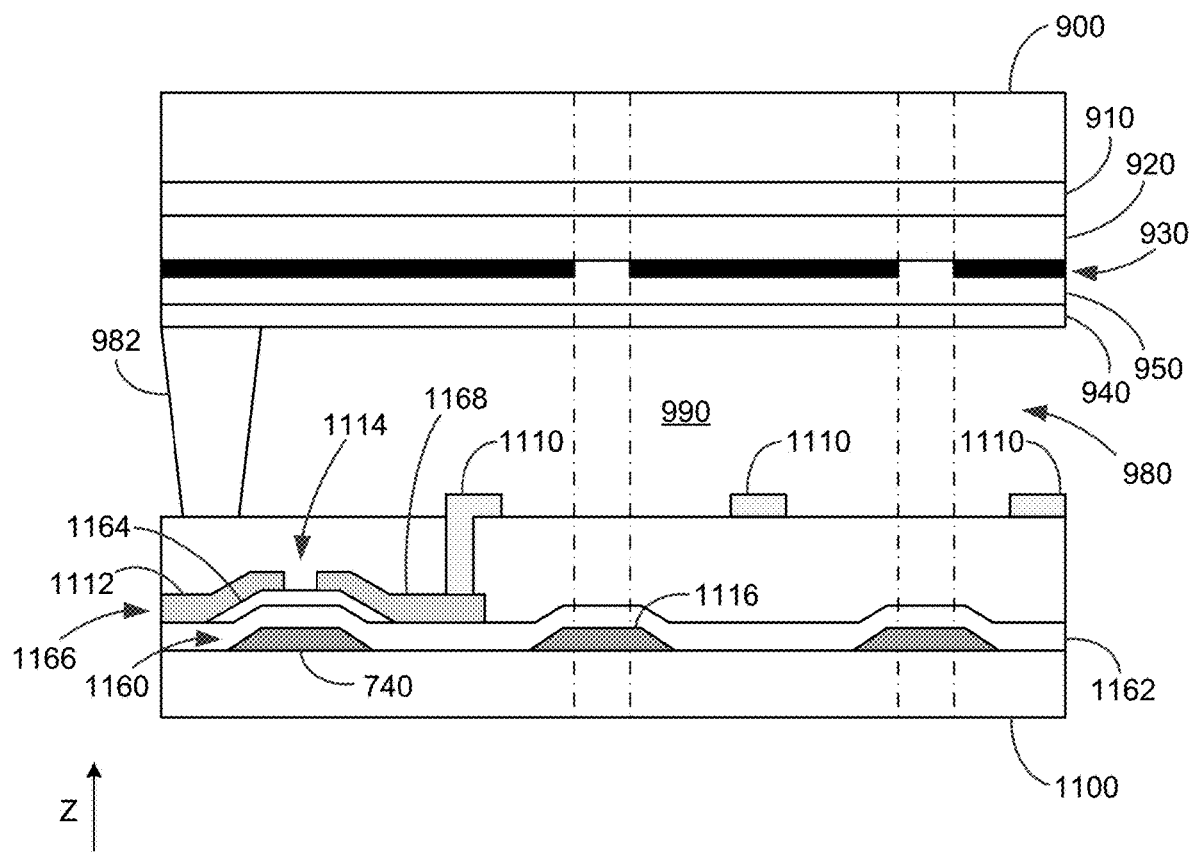
FIG. 12B is a schematic diagram depicting a cross-section of the components of FIGS. 9 and 11 in an assembled configuration, as viewed along section line 12B-12B.

FIGS. 11, 12A, and 12B depict a portion of another embodiment of a lower substrate and associated features that also may be used with the upper substrate of FIGS. 7 and 8. As shown in FIG. 11, a plurality of transparent electrodes (i.e., electrodes 1110, 1120 and 1130) are disposed on lower substrate 1100. Each of the electrodes is associated with a corresponding data line and thin film transistor, as well as a gate line 1140. Specifically, electrode 1110 is associated with data line 1112 and thin film transistor 1114, electrode 1120 is associated with data line 1122 and thin film transistor 1124, and electrode 1130 is associated with data line 1132 and thin film transistor 1134. Thin film transistors 1114, 1124, and 1134 are electrically connected to gate line 1140.

In this embodiment, each of the electrodes defines a plurality of openings. For instance, electrode 1110 includes eight such openings (e.g., openings 1115 and 1117). A shielding layer 1150 also is disposed on substrate 1100. Shielding layer 1150 includes multiple shield portions (e.g., shield portions 1116, 1118) that are positioned within an outer periphery of the associated electrode. By way of example, shield portions 1116 and 1118 are positioned within the interior of electrode 1110. More specifically, shield portion 1116 is positioned within opening 1115, and shield portion 1118 is positioned within opening 1117. It should be noted that, in this embodiment, the shield portions (e.g., shield portions 1116 and 1118) and gate line 1140 are present in a same layer.

As shown in FIG. 12B, a gate metal layer 1160 (e.g., an opaque metal layer) is disposed on substrate 1100 to form gate line 1140 and the shielding layer, which includes shield portion 1116. A gate insulator layer 1162 (e.g., SiNx, SiOx) is formed over gate metal layer 1160. TFT 1114 is formed over gate line 1140 by depositing amorphous silicon 1164 (e.g., N+ doped a:Si, oxide) followed by a material layer 1166 to form source/drain regions 1168 and data lines (e.g., data line 1112). It should be noted that TFT 1114 is positioned at an intersection of gate line 1140 and data line 1112.

Following TFT and data line formation, a passivation layer 1170 (e.g., SiNx, SiOx) is provided. Passivation layer 1170 is then configured to permit electrical connection between TFT 1114 and transparent pixel electrodes (e.g., pixel electrode 1110) disposed on passivation layer 1170. In this embodiment, pixel electrode 1110 may be formed of ITO, for example.

Similar to that shown with respect to FIGS. 8B, 9, and 10, a substrate 900 and associated features are provided and are not described again. Substrate 900 and the associated features are assembled with substrate 1100 as shown in FIG. 12B.

Figure 13:
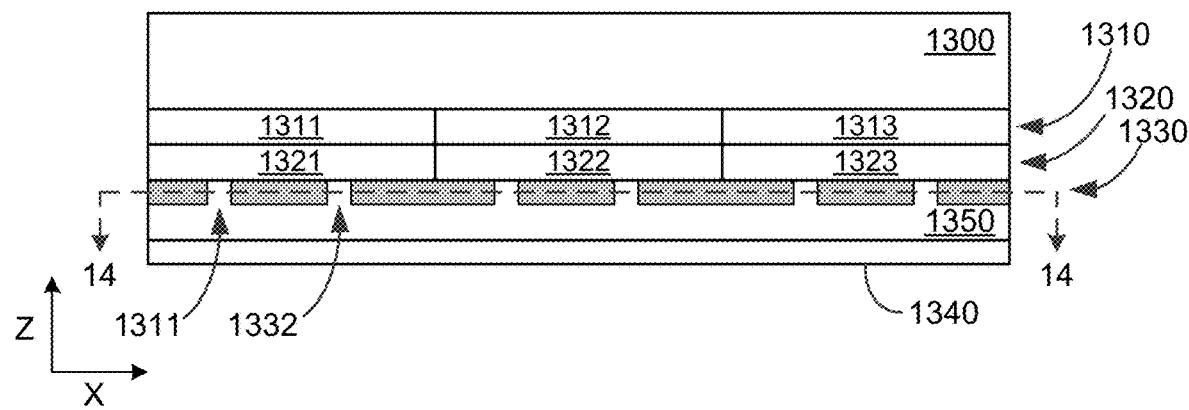
FIG. 13 is a schematic diagram depicting a cross-section of another embodiment of an upper substrate and associated features.
Figure 14:
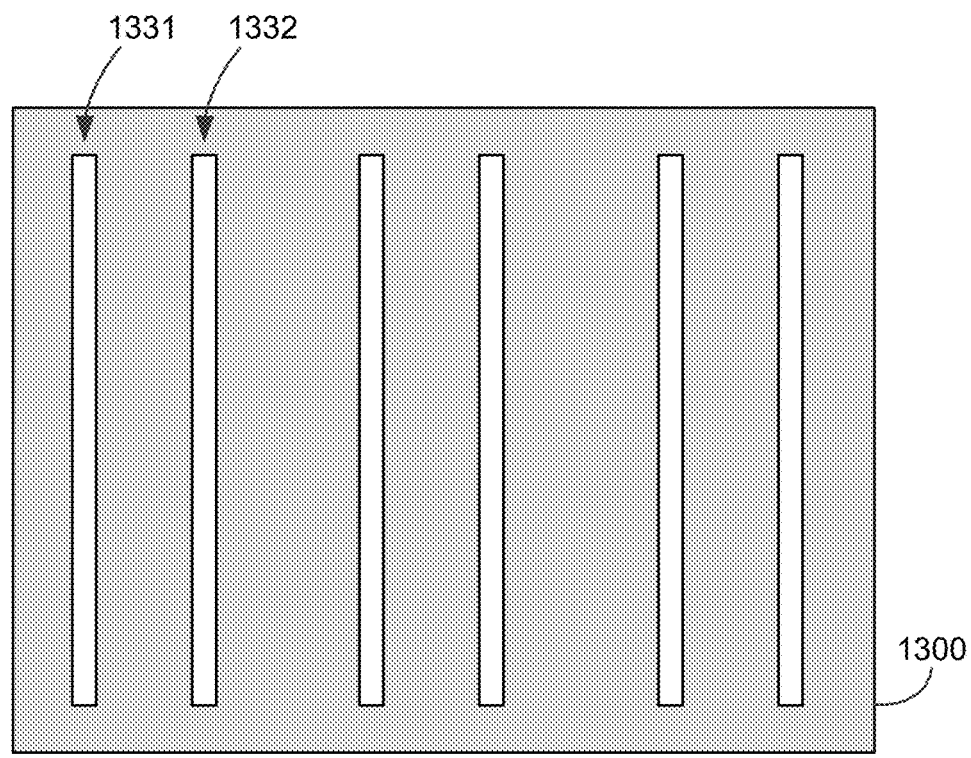
FIG. 14 is a schematic diagram depicting a plan view of the embodiment of FIG. 13, as viewed along section line 14-14.

FIGS. 13 and 14 depicting a portion of another embodiment of an upper substrate and associated features. As shown in FIG. 13, a color filter layer 1310 and a quantum dot layer 1320 are disposed on substrate 1300. Color filter layer 1310 includes regions 1311, 1312, and 1313, with each being associated with a different color. Similarly, quantum dot layer 1320 includes regions 1321, 1322, and 1323, with each being associated with a different color and aligned with a corresponding region of color filter layer 1310. A shielding layer 1330 also is disposed on substrate 1300. In particular, shielding layer 1330 defines a plurality of openings (e.g., openings 1331 and 1332). Additionally, transparent electrode 1340 is disposed on substrate 1300, with shielding layer 1330 being positioned between electrode 1340 and quantum dot layer 1320. Note that, in this embodiment, an insulating layer 1350 is disposed between shielding layer 1330 and electrode 1340. In this embodiment, as shown in FIG. 14, the openings in shielding layer 1330 are rectangular in shape, exhibiting a longer length along the y-axis.

Figure 15:
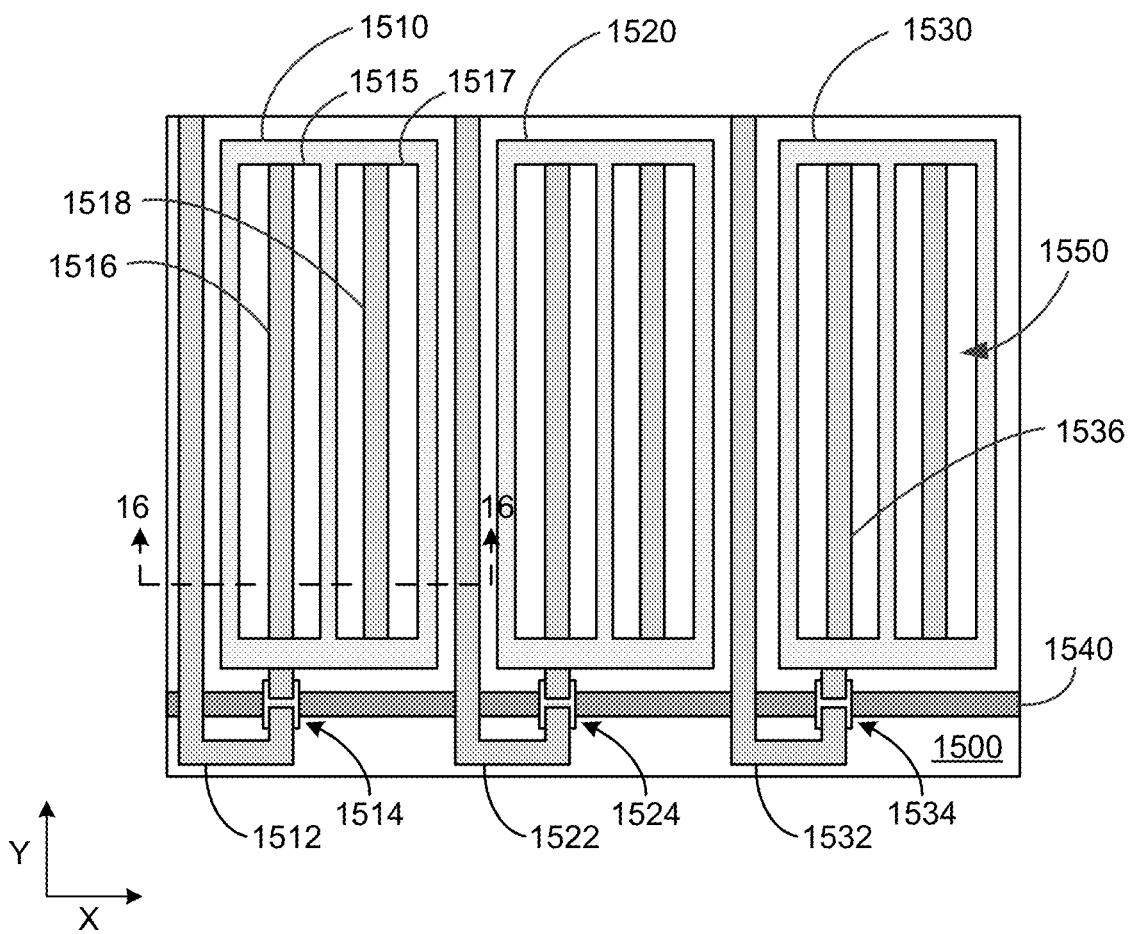
FIG. 15 is a schematic diagram depicting a plan view of another embodiment of a lower substrate and associated features.
Figure 16:
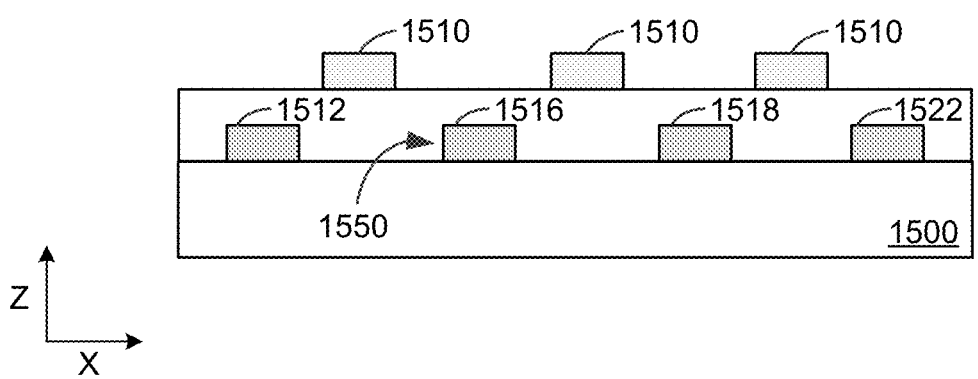
FIG. 16 is a schematic diagram depicting a cross-section of the embodiment of FIG. 15, as viewed along section line 16-16.

FIGS. 15 and 16 depict a portion of another embodiment of a lower substrate and associated features, which may be used with the upper substrate of FIGS. 13 and 14. As shown in FIG. 15, transparent electrodes (i.e., electrodes 1510, 1520 and 1530) are disposed lower substrate 1500. Each of the electrodes is associated with a corresponding data line and thin film transistor, as well as a gate line 1540. Specifically, electrode 1510 is associated with data line 1512 and thin film transistor 1514, electrode 1520 is associated with data line 1522 and thin film transistor 1524, and electrode 1530 is associated with data line 1532 and thin film transistor 1534.

In this embodiment, each of the electrodes is configured as a rectangle that defines a plurality of openings. For instance, electrode 1510 includes two such openings (e.g., openings 1515 and 1517). A shielding layer 1550 also is disposed on substrate 1500. Shielding layer 1550 includes multiple shield portions (e.g., shield portions 1516, 1518, 1536) that are positioned within an outer periphery of the associated electrode. By way of example, shield portions 1516 and 1518 are positioned within the interior of electrode 1510. More specifically, shield portion 1516 is positioned within opening 1515, and shield portion 1518 is positioned within opening 1517. As shown in FIG. 16, the data lines (e.g., data lines 1512 and 1522) and the shield portions are present in a same layer. Note also, that the shield portions are rectangular in this embodiment.

Figure 17:
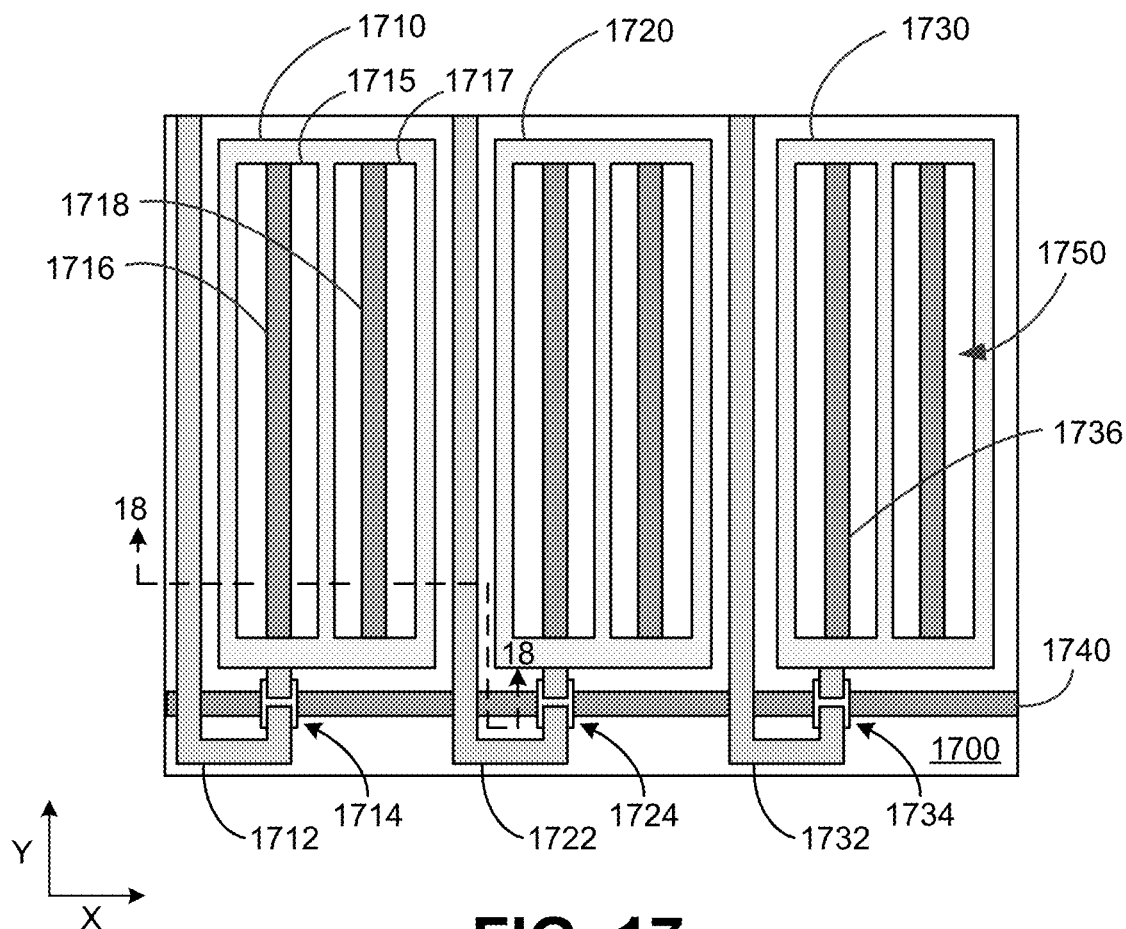
FIG. 17 is a schematic diagram depicting a plan view of another embodiment of a lower substrate and associated features.
Figure 18:
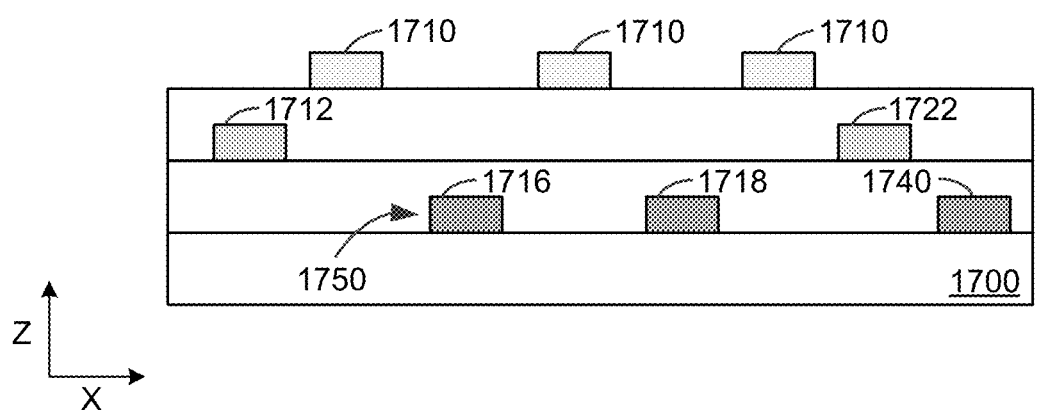
FIG. 18 is a schematic diagram depicting a cross-section of the embodiment of FIG. 17, as viewed along section line 18-18.

FIGS. 17 and 18 depict a portion of another embodiment of a lower substrate and associated features, which may be used with the upper substrate of FIGS. 13 and 14. As shown in FIG. 17, transparent electrodes (i.e., electrodes 1710, 1720 and 1730) are disposed lower substrate 1700. Each of the electrodes is associated with a corresponding data line and thin film transistor, as well as a gate line 1740. Specifically, electrode 1710 is associated with data line 1712 and thin film transistor 1714, electrode 1720 is associated with data line 1722 and thin film transistor 1724, and electrode 1730 is associated with data line 1732 and thin film transistor 1734.

In this embodiment, each of the electrodes is configured as a rectangle that defines a plurality of openings. For instance, electrode 1710 includes two such openings (e.g., openings 1715 and 1717). A shielding layer 1750 also is disposed on substrate 1700. Shielding layer 1750 includes multiple shield portions (e.g., shield portions 1716, 1718, 1736) that are positioned within an outer periphery of the associated electrode. By way of example, shield portions 1716 and 1718 are positioned within the interior of electrode 1710. More specifically, shield portion 1716 is positioned within opening 1715, and shield portion 1718 is positioned within opening 1717. As shown in FIG. 18, the gate line 1740 and the shield portions are present in a same layer.

Figure 19:
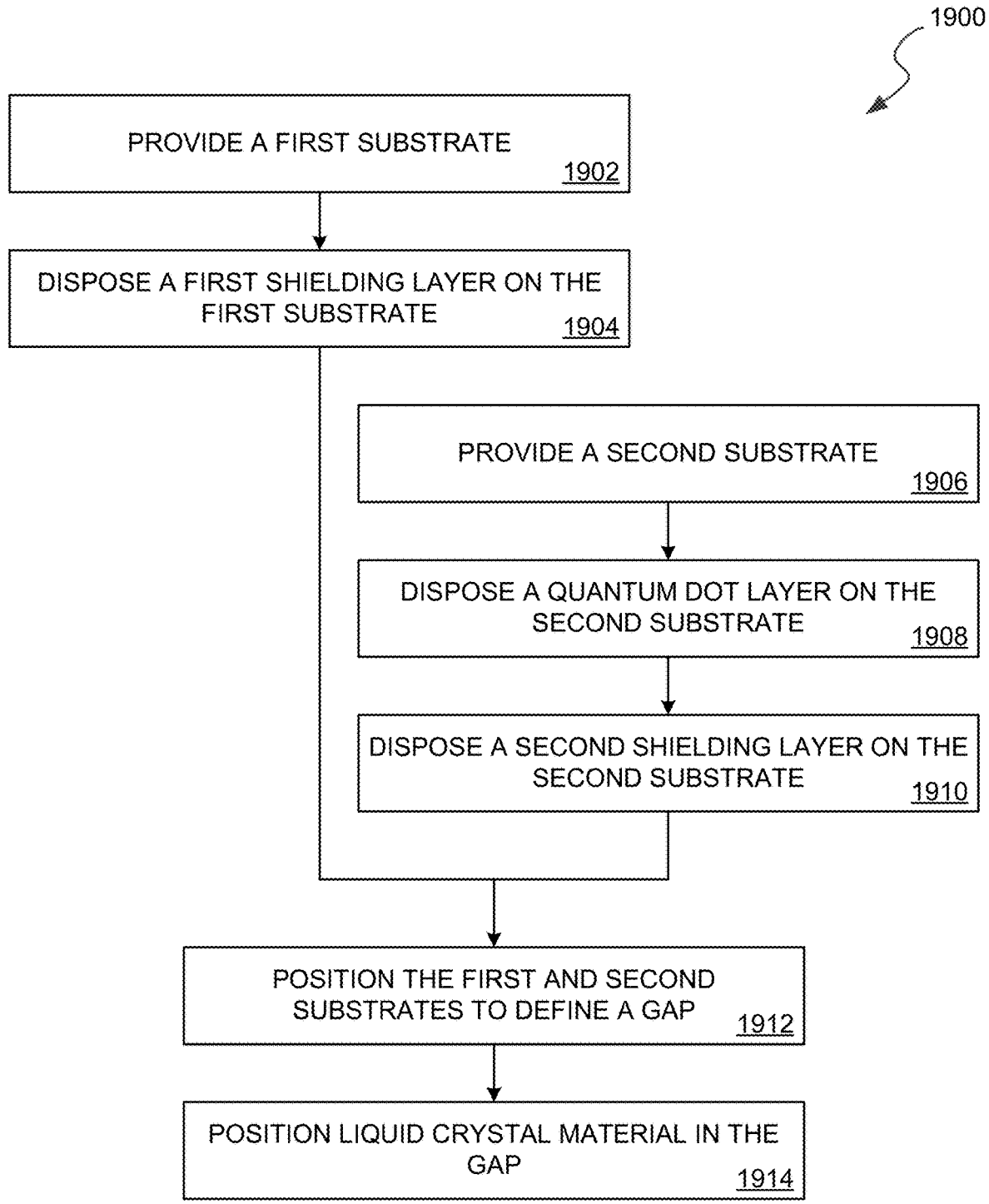
FIG. 19 is a flowchart depicting an embodiment of a method of forming a liquid crystal display device.

FIG. 19 is a flowchart depicting an embodiment of a method of forming a liquid crystal display device. In this regard, the method 1900 may be construed as beginning at block 1902, in which a first substrate is provided. In block 1904, a first shielding layer is disposed on the first substrate. In particular, the first shielding layer includes a plurality of first shield portions that are configured to prevent propagation of blue light therethrough.

In block 1906, a second substrate is provided. Then, in block 1908, a quantum dot layer is disposed on the second substrate. In block 1910, a second shielding layer is disposed on the second substrate. Notably, the second shielding layer defines a plurality of second openings that are configured to permit propagation of the blue light therethrough.

Proceeding to block 1912, the first substrate and the second substrate are positioned to define a gap therebetween. Thereafter, as depicted in block 1914, a liquid crystal material is positioned in the gap to form a liquid crystal layer. Specifically, the liquid crystal layer has a plurality of display pixels, with each of the display pixels being configured to be switchable between an on state and an off state. Additionally, each of the display pixels corresponds to at least one of the openings, and each of the openings corresponds to one of the first shield portions.

In some embodiments, when the display pixel is in the off state, the first shielding layer and the second shielding layer prevent propagation of the blue light to the quantum dot layer. However, when the display pixel is in the on state, liquid crystal molecules of the display pixel are driven to have a predetermined retardation to form at least one liquid crystal lens. So configured, the at least one liquid crystal lens refracts a portion of the blue light passing the first shielding layer so that the blue light directly penetrates through at least one of the openings to reach the quantum dot layer.

In some embodiments, the method further includes disposing a thin film transistor, a gate line, and a data line on the first substrate. In some of these embodiments, the first shielding layer and the gate line both are present in a same layer. In other embodiments, the first shielding layer and the data line both are present in a same layer.

The embodiments described above are illustrative of the invention and it will be appreciated that various permutations of these embodiments may be implemented consistent with the scope and spirit of the invention.

What is claimed is:

1. A liquid crystal display device, comprising:
   a first substrate;
   a gate line dispose on the first substrate;
   a data line disposed on the first substrate intersecting with the gate line;
   a second substrate spaced from the first substrate to define a gap there between;
   a liquid crystal layer, positioned in the gap, having a plurality of display pixels, wherein each of the display pixels of the liquid crystal layer is configured to be switchable between an on state and an off state;
   a quantum dot layer positioned in the gap between the liquid crystal layer and the second substrate;
   a first shielding layer positioned between the first substrate and the liquid crystal layer, the first shielding layer having a plurality of first shield portions configured to prevent propagation of blue light therethrough;
   a thin film transistor disposed on the first substrate, and electrically connecting to the gate line and the data line, and wherein the first shielding layer and at least one of the gate line or the data line are present in a same layer; and
   a second shielding layer positioned between the liquid crystal layer and the second substrate, the second shielding layer defining a plurality of openings, wherein the plurality of openings are configured to permit propagation of the blue light therethrough;
   wherein each of the display pixels of the liquid crystal layer corresponds to at least one of the openings, and each of the openings corresponds to one of the first shield portions; and
   wherein the first shielding layer and the second shielding layer are positioned such that, for each of the display pixels of the liquid crystal layer, when the display pixel is in the off state the blue light passing the first shielding layer is prevented from directly penetrating through at least one of the openings to reach the quantum dot layer.

2. The liquid crystal display device of claim 1, wherein:
   the liquid crystal display device further comprises a backlight module configured to emit blue light;

the first substrate is positioned between the backlight module and the liquid crystal layer; and the blue light emitted by the backlight module is directed through the first substrate and towards the liquid crystal layer.

3. The liquid crystal display device of claim 1, wherein the first shielding layer and the second shielding layer are positioned such that, for each of the display pixels of the liquid crystal layer, when the display pixel is in the on state with liquid crystal molecules of the display pixel being driven to have a predetermined retardation to form at least one liquid crystal lens, a portion of the blue light passing the first shielding layer is refracted by the at least one liquid crystal lens to directly penetrate through at least one of the openings to reach the quantum dot layer.

4. The liquid crystal display device of claim 3, further comprising:

a plurality of first transparent electrodes disposed between the first substrate and the liquid crystal layer; and a plurality of second transparent electrodes disposed between the second shielding layer and the liquid crystal layer, wherein at least one of the first transparent electrodes and at least one of the second transparent electrodes corresponds to each of the display pixels and are configured to switch the display pixels between the off state and the on state.

5. The liquid crystal display device of claim 1, wherein, in plan view:

each of the plurality of first shield portions is circular; and
each of the plurality of openings is circular.

6. The liquid crystal display device of claim 1, wherein, in plan view:

each of the plurality of first shield portions is rectangular; and each of the plurality of openings is rectangular.

7. The liquid crystal display device of claim 1, wherein:

the liquid crystal display device further comprises a plurality of first transparent electrodes disposed between the first substrate and the liquid crystal layer; and in plan view, the plurality of first transparent electrodes are configured as rectangles with the plurality of first shield portions being positioned within interiors of the rectangles.

8. The liquid crystal display device of claim 1, further comprising a color filter layer disposed between the quantum dot layer and the second substrate.

9. The liquid crystal display device of claim 1, wherein sizes of the first shield portions of the first shielding layer are bigger than or equal to sizes of corresponding ones of the openings of the second shielding layer.

10. The liquid crystal display device of claim 1, wherein the liquid crystal layer is formed of polymer dispersed liquid crystal material.

11. The liquid crystal display device of claim 10, wherein the liquid crystal display device lacks a polarizer.

12. The liquid crystal display device of claim 10, wherein the polymer dispersed liquid crystal material has a plurality of polymer-encapsulated liquid crystal droplets, and each of the plurality of polymer-encapsulated liquid crystal droplets has a droplet size smaller than 400 nm.

13. The liquid crystal display device of claim 1, wherein at least one of the first shielding layer or the second shielding layer is formed of black resin.

14. A method of forming a liquid crystal display device comprising:

providing a first substrate;

disposing a thin film transistor, a gate line, and a data line on the first substrate;

disposing a first shielding layer on the first substrate, the first shielding layer having a plurality of first shield portions configured to prevent propagation of blue light therethrough;

providing a second substrate;

disposing a quantum dot layer on the second substrate;

disposing a second shielding layer on the second substrate, the second shielding layer defining a plurality of second openings configured to permit propagation of the blue light therethrough;

positioning the first substrate and the second substrate to define a gap therebetween; and positioning a liquid crystal material in the gap to form a liquid crystal layer, having a plurality of display pixels, wherein each of the display pixels of the liquid crystal layer is configured to be switchable between an on state and an off state;

wherein each of the display pixels of the liquid crystal layer corresponds to at least one of the openings, and each of the openings corresponds to one of the first shield portions; and wherein the first shielding layer and at least one of the gate line or the data line are present in a same layer.

15. The method of claim 14, wherein, when the display pixel is in the on state, liquid crystal molecules of the display pixel are driven to have a predetermined retardation to form at least one liquid crystal lens such that a portion of the blue light passing the first shielding layer is refracted by the at least one liquid crystal lens to directly penetrate through at least one of the openings to reach the quantum dot layer.

16. The method of claim 14, wherein, when the display pixel is in the off state, the first shielding layer and the second shielding layer prevent propagation of the blue light to the quantum dot layer.

* * * * *